(12) United States Patent
Kummaraguntla et al.

(10) Patent No.: US 11,652,455 B2
(45) Date of Patent: May 16, 2023

(54) CHOP TONE MANAGEMENT FOR A CURRENT SENSOR OR A VOLTAGE SENSOR

(71) Applicant: Cirrus Logic International Semiconductor Ltd., Edinburgh (GB)

(72) Inventors: Ravi K. Kummaraguntla, Austin, TX (US); Christophe J. Amadi, Austin, TX (US); John L. Melanson, Austin, TX (US); Axel Thomsen, Austin, TX (US); John C. Tucker, Austin, TX (US); Eric J. King, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 155 days.

(21) Appl. No.: 17/173,813

(22) Filed: Feb. 11, 2021

(65) Prior Publication Data

US 2022/0255515 A1 Aug. 11, 2022

(51) Int. Cl.
*H03F 3/387* (2006.01)
*G01R 31/3842* (2019.01)
*G01R 31/40* (2020.01)
*H03F 3/181* (2006.01)

(52) U.S. Cl.
CPC ......... *H03F 3/387* (2013.01); *G01R 31/3842* (2019.01); *G01R 31/40* (2013.01); *H03F 3/181* (2013.01); *H03F 2200/03* (2013.01); *H03F 2200/375* (2013.01)

(58) Field of Classification Search
CPC ...... H03F 3/387; H03F 3/181; H03F 2200/03; H03F 2200/375; H03F 3/45475; G01R 31/3842; G01R 31/40; G01R 19/2506; H03M 1/0629; H03M 1/1245; H03M 3/34

USPC .................. 324/433, 426, 425, 512
See application file for complete search history.

(56) References Cited

U.S. PATENT DOCUMENTS

| | | | | |
|---|---|---|---|---|
| 4,017,812 A | * | 4/1977 | Bonnefoy-Claudet | .. H03D 5/00 327/119 |
| 4,266,131 A | * | 5/1981 | Ahjopalo | ............... G01N 21/37 250/341.1 |
| 5,740,025 A | * | 4/1998 | Siegling, III | ............ B60M 1/02 246/468 |

(Continued)

OTHER PUBLICATIONS

International Search Report and Written Opinion of the International Searching Authority, International Application No. PCT/US2022/012882, dated May 9, 2022.

(Continued)

*Primary Examiner* — Giovanni Astacio-Oquendo
(74) *Attorney, Agent, or Firm* — Jackson Walker L.L.P.

(57) ABSTRACT

A signal processing system may include a signal path and a chop management circuit. The signal path may comprise a chopper configured to chop a differential input signal to the signal path at a chopping frequency and a low-pass filter downstream of the chopper and configured to filter out intermodulation products of a direct current offset of the signal path and intermodulation products of an aggressor on the differential input signal in order to generate an output signal. The chop management circuit may be communicatively coupled to the chopper and configured to, based on operational parameters associated with the signal path, dynamically manage energy of one or more clock signals used to define the chopping frequency.

31 Claims, 4 Drawing Sheets

(56) References Cited

U.S. PATENT DOCUMENTS

| | | | | |
|---|---|---|---|---|
| 7,953,467 B2* | 5/2011 | Dabiri | .................. | A61B 5/0062 |
| | | | | 600/407 |
| 8,258,863 B2 | 9/2012 | Gupta et al. | | |
| 9,521,979 B2 | 12/2016 | Stanslaski et al. | | |
| 2007/0268961 A1* | 11/2007 | Lin | ...................... | H03D 3/007 |
| | | | | 375/152 |
| 2021/0082666 A1* | 3/2021 | Zhao | ................. | H01J 37/32183 |

OTHER PUBLICATIONS

Guo, Jing et al., "Wide dynamic range front-end amplifier for cell recording with microelectrode arrays", Biomedical Circuits and Systems Conference, 2009, Nov. 26, 2009, pp. 65-68, IEEE, Piscataway, NJ, USA.

* cited by examiner

CHOP TONE MANAGEMENT FOR A CURRENT SENSOR OR A VOLTAGE SENSOR

FIELD OF DISCLOSURE

The present disclosure relates in general to circuits for electronic devices, including without limitation personal portable devices such as wireless telephones and media players, and more specifically, to chop tone management techniques for a current sensor or a voltage sensor that may be used in battery management and/or in a power delivery network.

BACKGROUND

Portable electronic devices, including wireless telephones, such as mobile/cellular telephones, tablets, cordless telephones, mp3 players, and other consumer devices, are in widespread use. Such a portable electronic device may include circuitry for implementing a power converter for converting a battery voltage (e.g., provided by a lithium-ion battery) into a supply voltage delivered to one or more components of the portable electronic device. The power delivery network may also regulate such supply voltage, and isolate the downstream loads of these one or more devices from fluctuation in an output voltage of the battery over the course of operation.

In addition to regulating the supply rail for the supply voltage, it may be desirable for the power converter (or a control circuit for the power converter) to provide for active protection mechanisms to limit an amount of current that can be drawn by the one or more components powered from the supply rail. For example, such active protection mechanisms may provide protection for a battery that supplies energy to the power delivery network.

Such battery protection schemes may include control circuitry that may sense physical quantities associated with the power delivery network (e.g., voltages, currents, etc.) to ensure operation of the power delivery network within allowable ranges. Such sensing circuitry may use analog-to-digital conversion systems in order to convert an analog measurement of a physical quantity into an equivalent digital representation. In addition to an analog-to-digital converter, analog-to-digital conversion systems may include additional circuitry, such as filters, to further condition the measured physical quantity.

Battery management systems may depend heavily on accurate current and voltage sensing in order to find a good tradeoff between fast charging and battery life. Moreover, the dynamic range of current sensing and voltage sensing required in such systems may be quite wide. For example, a current sensor used in a typical battery management system may need to detect a 1-milliamp current and a 40-amp current with similar relative accuracy. Such an accuracy requirement imposes stringent constraints on the offset and the linearity performance of the sensor.

Figure 1:
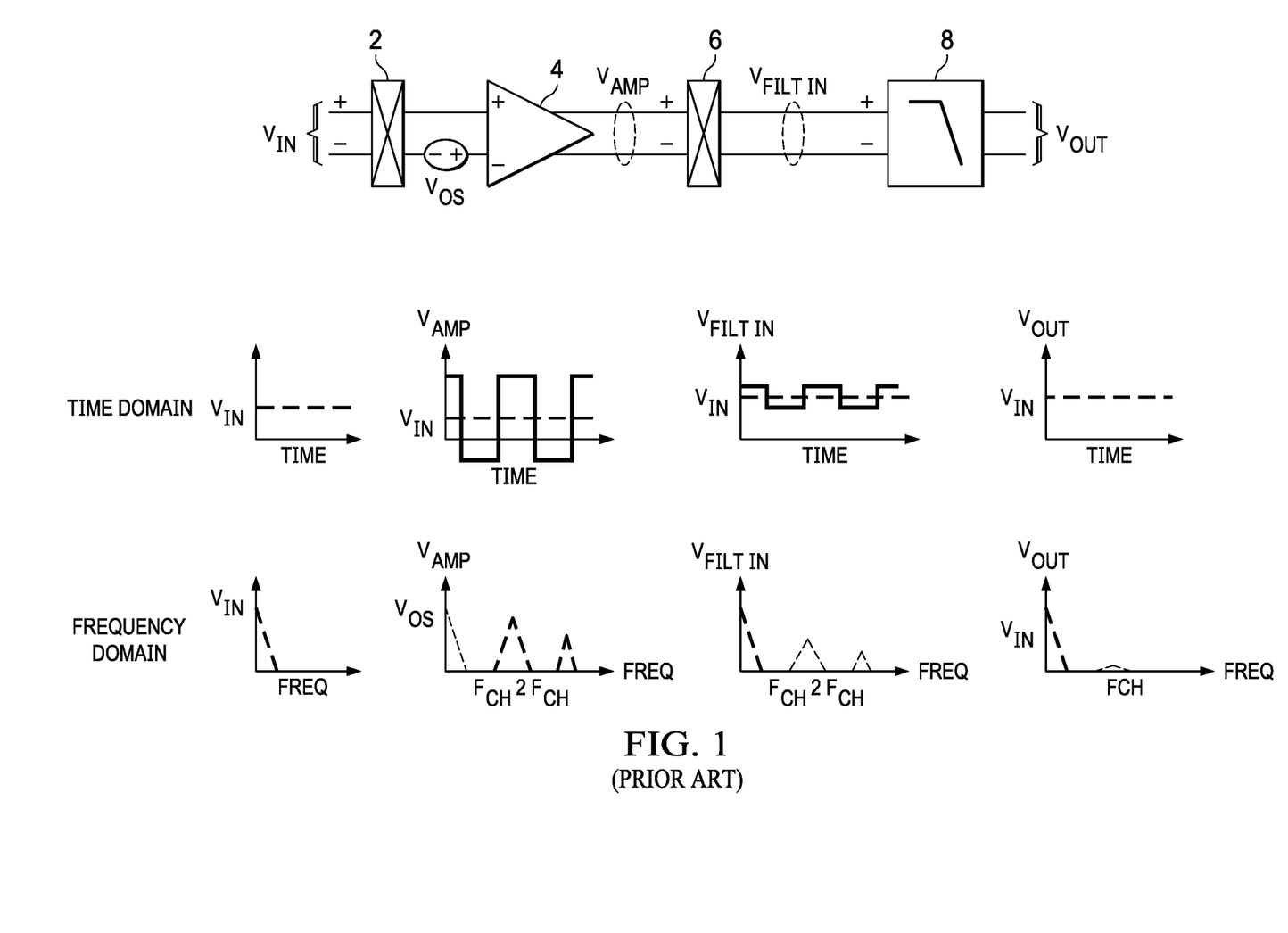
FIG. 1 illustrates the basic principle of chopping in the time domain and in the frequency domain, as is known in the art.

This problem is similar to that of precision amplifier design where chopping is extensively used to minimize the impact of circuit offset. The basic idea of chopping is to move the direct-current offset of a circuit to a higher frequency which then is filtered out either by an analog or a digital filter. FIG. 1 illustrates the basic principle of chopping in the time domain and in the frequency domain, as is known in the art. Several variations of chopping exist in the art, but almost all of them use a clock to periodically swap the differential inputs of an amplifier or a sensor. For example, as shown in FIG. 1, a chop block 2 may apply chopping at a chopping frequency $F_{CH}$ to a differential input signal $V_{IN}$ having a differential signal. An amplifier 4 with a direct current offset $V_{OS}$ may amplify the chopped differential input signal $V_{IN}$ to generate an amplifier output signal $V_{AMP}$ periodic in nature and having direct current offset $V_{OS}$. Another chop block 6 may apply chopping at chopping frequency $F_{CH}$ to amplifier output signal $V_{AMP}$ resulting in a filter input signal $V_{FILTIN}$. As shown in FIG. 1, by using such chopping, direct current offset $V_{OS}$ may be modulated into one or more harmonics of chopping frequency $F_{CH}$. Accordingly, low-pass filter 8 may filter out such harmonics and generate a differential output signal $V_{OUT}$ equivalent to differential input signal $V_{IN}$. The ability to reduce or eliminate direct current offset $V_{OS}$ by simply alternating the positive and negative inputs of a sensor at periodic intervals makes chopping a very attractive circuit technique especially for high precision, and low power sensors.

Figure 2:
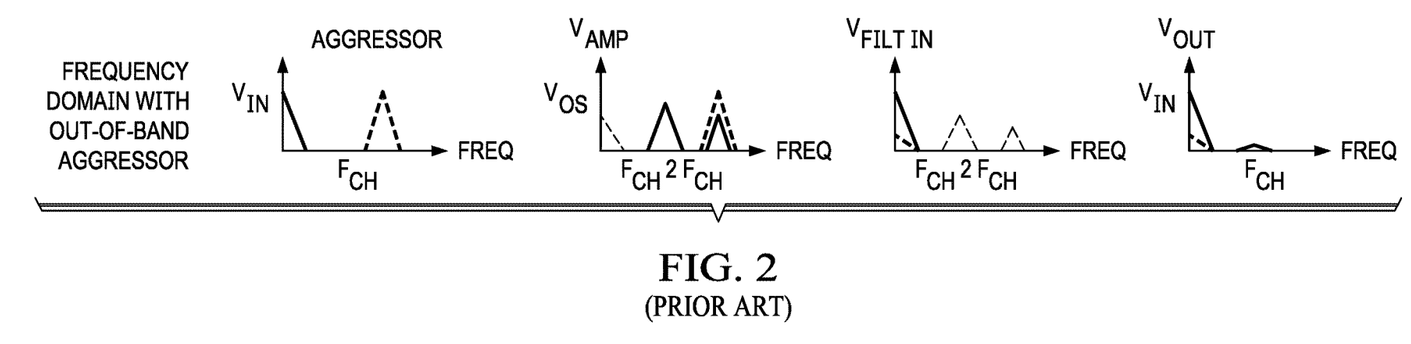
FIG. 2 illustrates chopping in a signal path in the presence of an aggressor at or near the chopping frequency, as is known in the art.

Because chopping depends on one or more clocks to periodically swap the differential components of differential input signal $V_{IN}$, chopping may introduce chop clock frequency tones, which otherwise would not exist, into the signal path. These chop clock tones may intermodulate with either in-band desired signals, or out-of-band aggressor signals entering the signal path, to create in-band spurs. FIG. 2 illustrates the intermodulation mechanism wherein an out-of-band aggressor signal mixes with the chop clock tones and the resulting down-converted spurs fall within the in-band frequency spectrum of the desired signal (e.g., differential input signal $V_{IN}$). The energy of the in-band spurs may depend heavily on the energy of the chopping clock tones, the frequency of the chopping tones, the non-linearity of the signal path, and the energy of the out-of-band aggressor signals.

Further, in a typical battery management system, the undesired out-of-band tones may be much larger than the desired signal. In such cases, the spurs resulting from the mixing of out-of-band tones with the chopping clock tones may overwhelm the desired signal and severely limit the performance of a sensor. Because the common sources of out-of-band tones in a battery management system are the battery load and any integrated power converters, not much can be done to avoid the aggressors, and thus approaches are desired to effectively remove such aggressors from the desired signal.

SUMMARY

In accordance with the teachings of the present disclosure, certain disadvantages and problems associated with existing sensor systems may be reduced or eliminated.

In accordance with embodiments of the present disclosure, a signal processing system may include a signal path and a chop management circuit. The signal path may comprise a chopper configured to chop a differential input signal to the signal path at a chopping frequency and a low-pass filter downstream of the chopper and configured to filter out intermodulation products of a direct current offset of the signal path and intermodulation products of an aggressor on the differential input signal in order to generate an output signal. The chop management circuit may be communicatively coupled to the chopper and configured to, based on operational parameters associated with the signal path, dynamically manage energy of one or more clock signals used to define the chopping frequency.

In accordance with these and other embodiments of the present disclosure, a method may be used in a signal processing system comprising a signal path having a chopper configured to chop a differential input signal to the signal path at a chopping frequency and a low-pass filter downstream of the chopper and configured to filter out intermodulation products of a direct current offset of the signal path and intermodulation products of an aggressor on the differential input signal in order to generate an output signal. The method may include, based on operational parameters associated with the signal path, dynamically managing energy of one or more clock signals used to define the chopping frequency.

In accordance with these and other embodiments of the present disclosure, a mobile device may include a circuit and a sensing system configured to sense a physical quantity associated with the circuit. The sensing system may include a sense path and a chop management circuit communicatively coupled to the chopper. The sensing system may include a chopper configured to chop a differential input signal to the sense path at a chopping frequency, wherein the differential input signal is indicative of the physical quantity and a low-pass filter downstream of the chopper and configured to filter out intermodulation products of a direct current offset of the sensor path and intermodulation products of an aggressor on the differential input signal in order to generate an output signal. The chop management circuit may be configured to, based on operational parameters associated with the sensor path, dynamically manage energy of one or more clock signals used to define the chopping frequency.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 3:
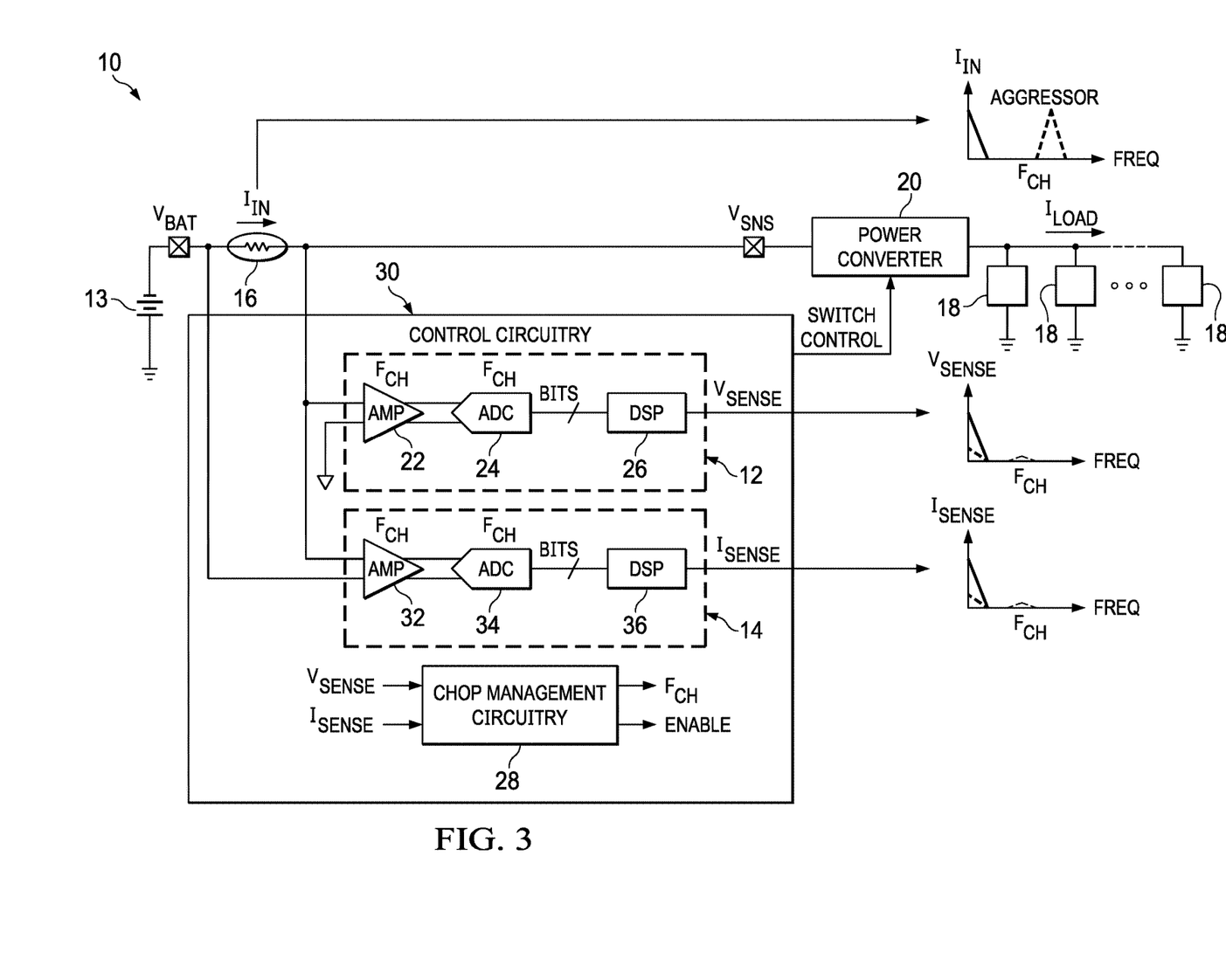
FIG. 3 illustrates a block diagram of selected components of a power delivery network, in accordance with embodiments of the present disclosure.

FIG. 3 illustrates a block diagram of selected components of a power delivery network 10, in accordance with embodiments of the present disclosure. In some embodiments, power delivery network 10 may be implemented within a portable electronic device, such as a smart phone, tablet, game controller, and/or other suitable device.

As shown in FIG. 3, power delivery network 10 may include a battery 13 and a power converter 20 configured to convert a battery voltage $V_{BAT}$ generated by battery 13 into a supply voltage $V_{SUPPLY}$ used to power a plurality of downstream components 18, wherein each downstream component 18 may draw a respective current from the output of power converter 20, resulting in an aggregate load current that may be generated by power converter 20. Power converter 20 may be implemented using a boost converter, buck converter, buck-boost converter, transformer, charge pump, and/or any other suitable power converter. Downstream components 18 of power delivery network 10 may include any suitable functional circuits or devices of power delivery network 10, including without limitation other power converters, processors, audio coder/decoders, amplifiers, display devices, etc.

Power delivery network 10 may also include control circuitry 30 for controlling operation of power converter 20 that draws current $I_{IN}$, as well as implementing active protection mechanisms for limiting current $I_{IN}$ drawn from battery 13. For example, control circuitry 30 may include a voltage sensor 12 for measuring battery voltage $V_{BAT}$ and a current sensor 14 for measuring input current $I_{IN}$ based on battery voltage $V_{BAT}$ and a sense voltage $V_{SNS}$, (e.g., $I_{IN}=(V_{BAT}-V_{SNS})/R$), wherein R is a resistance of a sense resistor 16. Based on such measurements, control circuitry 30 may control power converter 20 to implement active protection mechanisms to limit current $I_{IN}$. Details of battery protection mechanisms are beyond the scope of this disclosure.

As shown in FIG. 3, voltage sensor 12 may include an amplifier 22 configured to amplify a sense voltage $V_{SNS}$, an analog-to-digital converter (ADC) 24 configured to convert the amplified sense voltage $V_{SNS}$ to an equivalent digital signal, and a digital signal processor (DSP) 26 configured to perform further processing (e.g., including low-pass filtering) on the equivalent digital signal to generate an output digital voltage signal $V_{SENSE}$ indicative of measured sense voltage $V_{SNS}$. As shown in FIG. 3, amplifier 22 and ADC 24 may each receive a chopping clock signal with chopping frequency $F_{CH}$. Although not explicitly shown in FIG. 3, amplifier 22 may include a chopping block at its input configured to chop differential sense voltage $V_{SNS}$ at chopping frequency $F_{CH}$. Further, although not explicitly shown in FIG. 3, ADC 24 may include a chopping block at its input configured to chop the amplified and chopped differential sense voltage $V_{SNS}$ generated by amplifier 22 at chopping frequency $F_{CH}$. Consequently, DSP 26 may perform low-pass filtering to filter out any direct current offset in the voltage sensing path.

Similarly, also as shown in FIG. 3, current sensor 14 may include an amplifier 32 configured to amplify a voltage $V_{SNS}-V_{BAT}$ indicative of current through sense resistor 16, an ADC 34 configured to convert the amplified voltage $V_{SNS}-V_{BAT}$ to an equivalent digital signal, and a DSP 36 configured to perform further processing (e.g., including low-pass filtering) on the equivalent digital signal to generate an output digital current signal $I_{SENSE}$ indicative of measured voltage $V_{SNS}-V_{BAT}$ (and thus, indicative of current $I_{IN}$). As shown in FIG. 3, amplifier 32 and ADC 34 may each receive a chopping clock signal with chopping frequency $F_{CH}$. Although not explicitly shown in FIG. 3, amplifier 32 may include a chopping block at its input configured to chop differential voltage $V_{SNS}-V_{BAT}$ at chopping frequency $F_{CH}$. Further, although not explicitly shown in FIG. 3, ADC 34 may include a chopping block at its input configured to chop the amplified and chopped differential voltage $V_{SNS}-V_{BAT}$ generated by amplifier 32 at chopping frequency $F_{CH}$. Consequently, DSP 36 may perform low-pass filtering to filter out any direct current offset in the current sensing path.

Because control circuitry 30 includes on-chip voltage sensor 12 and current sensor 14, control circuitry 30 may have good knowledge of the occurrence and the level of the out-of-band aggressors. Moreover, in embodiments in which control circuitry shares an integrated circuit with power converter 20, information derived from voltage sensor 12 and current sensor 14 may be used to determine the switching frequency and number of phases enabled in power converter 20. Hence, control circuitry 30 may have firsthand information about the operational modes of power converter 20 and may be able to accurately predict aggressor tones ahead of time. Accordingly, control circuitry 30 may use such information to, as described in greater detail below, dynamically manage the energy and the frequencies of the chopping tones, thereby minimizing inaccuracies caused by chopping tone intermodulation.

FIG. 3 also illustrates how out-of-band aggressor tones on current $I_{IN}$, coming either from a load on battery 13 and/or from power converter 20, may interact with chopping tones at chopping frequency $F_{CH}$ to create in-band spurs on output digital voltage signal $V_{SENSE}$ and output digital current signal $I_{SENSE}$.

To reduce or eliminate such in-band spurs arising from aggressors, control circuitry 30 may include chop management circuitry 28 configured to, based on output digital voltage signal $V_{SENSE}$, output digital current signal $I_{SENSE}$, operational conditions on the load of battery 13, operational conditions of power converter 20, and/or other suitable operational parameters of power delivery network 10, dynamically manage the chopping clock energy and the frequency of signal chopping within voltage sensor 12 and/or current sensor 14. In some embodiments, chop management circuitry 28 may dynamically manage chopping by dynamically enabling and disabling chopping in voltage sensor 12 and/or current sensor 14. In these and other embodiments, chop management circuitry 28 may dynamically manage chopping by dynamically varying chopping frequency $F_{CH}$ to avoid intermodulation tones of aggressors from falling within frequencies of interest.

With respect to dynamically enabling and disabling chopping in voltage sensor 12 and/or current sensor 14, chop management circuitry 28 may decide whether offset performance of voltage sensor 12 and/or current sensor 14 is more critical than occurrence of intermodulation spurs. For example, when the energy of the desired signal for output digital voltage signal $V_{SENSE}$ and/or output digital current signal $I_{SENSE}$ is large, avoidance of intermodulation products may be more critical than reduction of sensor direct current offset. Thus, in such cases, if output digital voltage signal $V_{SENSE}$ and/or output digital current signal $I_{SENSE}$ exceeds a predetermined threshold, chop management circuitry 28 may dynamically disable chopping in one or both of voltage sensor 12 and current sensor 14. Accordingly, chop management circuitry 28 may essentially trade off direct current offset and noise performance of a sensor signal path for higher linearity and fewer in-band spurs for higher signal levels of output digital voltage signal $V_{SENSE}$ and/or output digital current signal $I_{SENSE}$. Similarly, when the energy of the desired signal for output digital voltage signal $V_{SENSE}$ and/or output digital current signal $I_{SENSE}$ is small, sensor accuracy may be more critical than avoidance of intermodulation products, and chop management circuitry 28 may accordingly enable chopping to improve direct current offset and noise performance.

Figure 4:
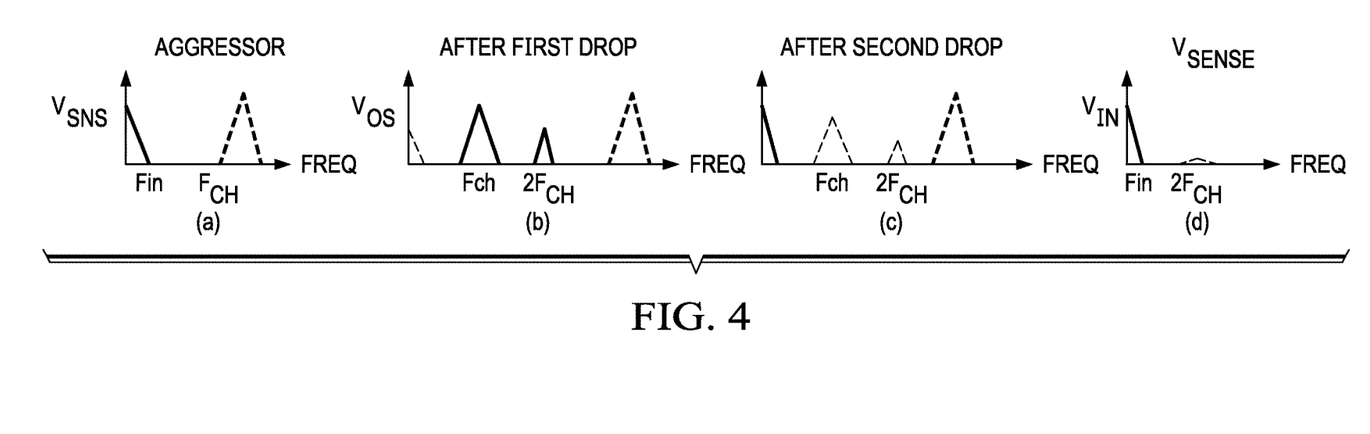
FIG. 4 illustrates example waveforms demonstrating potential advantages of managing chopping frequency, in accordance with embodiments of the present disclosure.

In addition to or in lieu of dynamically enabling or disabling chopping, chop management circuitry 28 may also perform frequency management chopping frequency $F_{CH}$. FIG. 4 illustrates an example case in which chop management circuitry 28 is dynamically chosen to be much smaller than a frequency of an aggressor, in accordance with embodiments of the present disclosure. As shown in FIG. 4(a), an aggressor signal may be present on sense voltage $V_{SNS}$, and chop management circuitry 28 may set chopping frequency $F_{CH}$ at a frequency much lower than that of the frequency spectrum of the aggressor. After a first chopping operation at the input of amplifier 22, as shown in FIG. 4(b), intermodulation products of the aggressor may appear at much higher frequencies than intermodulation products of the desired signal at the harmonics of chopping frequency $F_{CH}$. After the second chopping operation at the input of ADC 24, as shown in FIG. 4(c), intermodulation products of the aggressor may appear at much higher frequencies than intermodulation products of the direct current offset at the harmonics of chopping frequency $F_{CH}$. Accordingly, after low-pass filtering performed by DSP 26, artifacts of the aggressor may be filtered from output digital voltage signal $V_{SENSE}$, as shown in FIG. 4(d). Accordingly, chop management circuitry 28 may filter out both an aggressor and its intermodulation products and frequency-manage the aggressor frequency ranges outside of frequency ranges of the desired signals. These dynamic frequency-management techniques may also be extended to include spread-spectrum techniques where the energy in the chop clock is spread out over multiple frequencies to reduce or eliminate intermodulation spurs.

The dynamic frequency management performed by chop management circuitry 28 may also be used to prevent crosstalk between voltage sensor 12 and current sensor 14. To illustrate, as shown in FIG. 3, in a typical battery management system, voltage sensor 12 and current sensor 14 may share input nodes. If the front-end amplifiers of the two sensors are chopped, the chopping tones of one sensor may propagate into the other sensor via the shared nodes. Such crosstalk may affect each sensor's accuracy based on whether the other sensor is enabled or disabled. In such cases, because chop management circuitry 28 may be aware of how many sensors are on at a given time, chop management circuitry 28 may decide whether to enable or disable chopping and/or may decide to use different chopping frequencies for the two sensors.

The crosstalk reduction mechanism described above may exist within the signal path of a given sensor. For example, as shown in FIG. 3, if current sensor 14 employs chopping both in its amplifier 32 and ADC 34, chopping tones of the amplifier 32 may act as the out-of-band aggressors for the ADC 34. In such cases, chop management circuitry 28 may decide to use different chop clock frequencies for amplifier 32 and ADC 34 in order to minimize the spurs. In such a case, in addition to the dynamic chop frequency management, chop management circuitry 28 may also use different chop clock phases to reduce the impact of the spurs.

Figure 5:
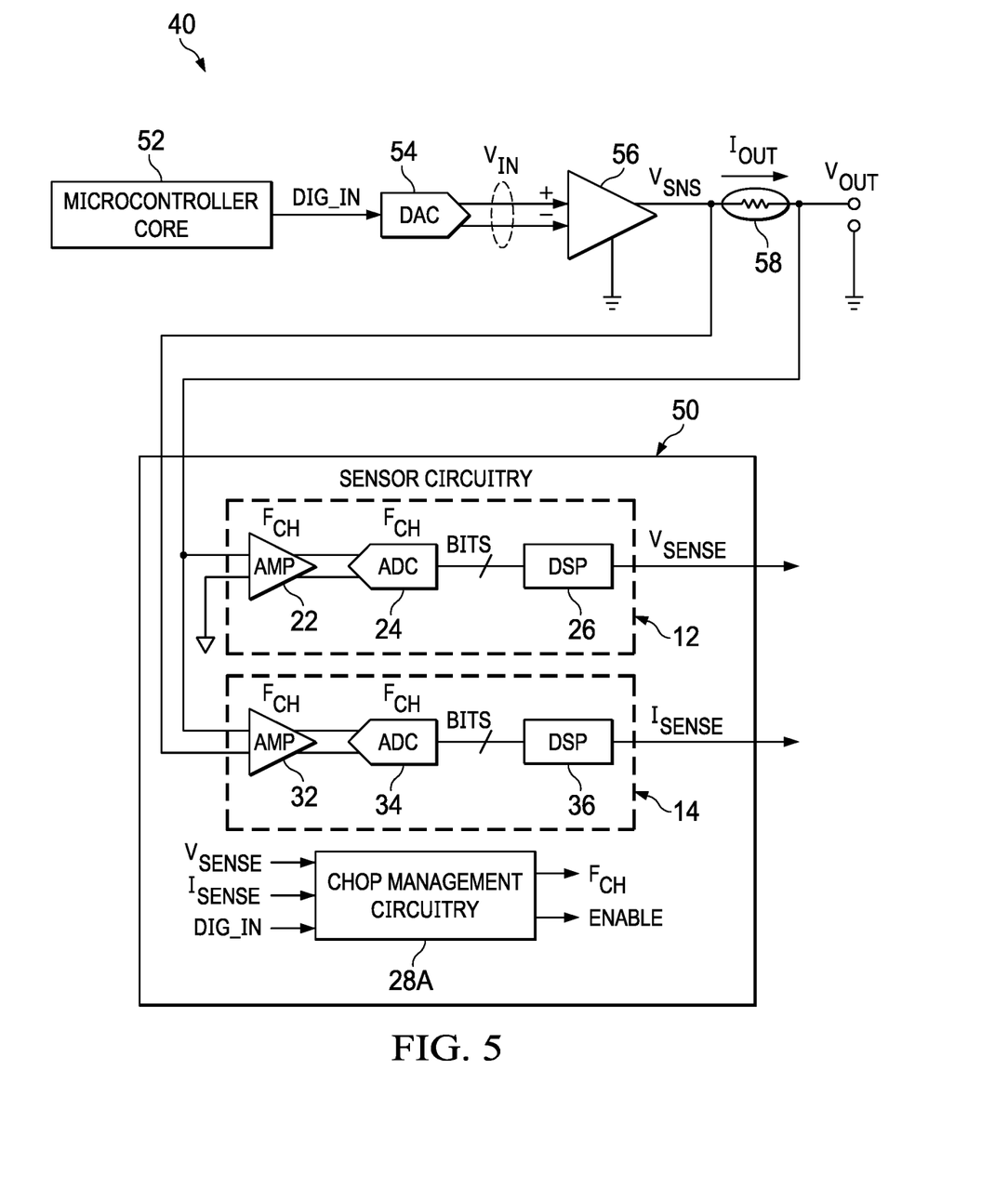
FIG. 5 illustrates a block diagram of selected components of an example audio integrated circuit, in accordance with embodiments of the present disclosure.

In addition to using dynamic chop frequency management in a power delivery network as described above, similar or identical techniques may be utilized in any other suitable circuit, system, and/or signal path for which such techniques may be useful. As a particular example, FIG. 5 illustrates a block diagram of selected components of an example audio integrated circuit 40 (e.g., as may be used in a personal audio device, smart phone, or other mobile device), in accordance with embodiments of the present disclosure. As shown in FIG. 5, a microcontroller core 52 may supply a digital audio input signal DIG_IN to a digital-to-analog converter (DAC) 54, which may convert the digital audio input signal to an equivalent analog input signal $V_{IN}$. DAC 54 may supply analog input signal $V_{IN}$ to an amplifier 56 which may amplify or attenuate analog input signal $V_{IN}$ to provide an audio output signal $V_{OUT}$, which may operate a speaker, headphone transducer, a line level signal output, and/or other suitable output.

Audio integrated circuit 40 may also include sensor circuitry 50 for sensing output current $I_{OUT}$ and output voltage $V_{OUT}$ of amplifier 56. For example, sensor circuitry 50 may include a voltage sensor 12 for measuring output voltage $V_{OUT}$ and a current sensor 14 for measuring output current $I_{OUT}$ based on output voltage $V_{BAT}$ and a sense voltage $V_{SNS}$, (e.g., $I_{IN}=(V_{BAT}-V_{SNS})/R$, wherein R is a resistance of a sense resistor 58).

To reduce or eliminate in-band spurs arising from aggressors within the signal path of audio integrated circuit 40, audio integrated circuit 40 may include chop management circuitry 28A configured to, based on output digital voltage signal $V_{SENSE}$, output digital current signal $I_{SENSE}$, digital audio input signal DIG_IN (or other signal within the signal path of audio integrated circuit 40), operational conditions of amplifier 56, operational conditions of audio integrated circuit 40, and/or other suitable operational parameters of audio integrated circuit 40, dynamically manage the chopping clock energy and the frequency of signal chopping within voltage sensor 12 and/or current sensor 14.

Chop management circuitry 28A of FIG. 5 may be similar or identical in many respects to chop management circuitry 28 of FIG. 3. Thus, in some embodiments, chop management circuitry 28A may dynamically manage chopping by dynamically enabling and disabling chopping in voltage sensor 12 and/or current sensor 14. In these and other embodiments, chop management circuitry 28 may dynamically manage chopping by dynamically varying chopping frequency $F_{CH}$ to avoid intermodulation tones of aggressors from falling within frequencies of interest.

Although the foregoing contemplates sensing paths with two chopping operations within the path, it is understood that the foregoing dynamic chopping techniques could be applied to a sensing path or other signal path with a single chopping operation, or multiple chopping operations.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A signal processing system comprising:
   a signal path comprising:
      a chopper configured to chop a differential input signal to the signal path at a chopping frequency;
      a low-pass filter downstream of the chopper and configured to filter out intermodulation products of a direct current offset of the signal path and intermodulation products of an aggressor on the differential input signal in order to generate an output signal; and
      a second chopper downstream of the chopper and upstream of the low-pass filter configured to chop a first differential intermediate signal derived from the differential input signal at a second chopping frequency to generate a second differential intermediate signal; and
   a chop management circuit communicatively coupled to the chopper and the second chopper and configured to, based on operational parameters associated with the signal path;
      dynamically manage energy of one or more clock signals used to define the chopping frequency; and dynamically manage energy of one or more clock signals used to define the second chopping frequency.

2. The signal processing system of claim 1, wherein dynamically managing energy of the one or more clock signals comprises dynamically modifying at least one of the chopping frequency and the second chopping frequency.

3. The signal processing system of claim 1, wherein dynamically modifying at least one of the chopping frequency and the second chopping frequency comprises modifying the chopping frequency and the second chopping frequency to have different frequency levels.

4. The signal processing system of claim 1, wherein the first chopping frequency is equal to the second chopping frequency.

5. The signal processing system of claim 1, wherein the signal path implements a sensor for sensing a physical electrical quantity.

6. The signal processing system of claim 5, wherein the physical electrical quantity comprises either a voltage associated with a battery or a current delivered from the battery.

7. The signal processing system of claim 6, wherein the operational parameters comprise operational conditions of a power converter and the physical electrical quantity is associated with operation of the power converter.

8. The signal processing system of claim 5, wherein the physical electrical quantity comprises either a voltage associated with an audio amplifier or a current associated with the audio amplifier.

9. The signal processing system of claim 1, wherein the operational parameters comprise one or more parameters selected from:
operational conditions of a battery;
a voltage associated with the battery; and
a current delivered from the battery.

10. The signal processing system of claim 1, wherein the operational parameters comprise operational conditions associated with an audio signal path comprising an amplifier.

11. The signal processing system of claim 10, wherein the operational parameters comprise characteristics of an audio signal within the audio signal path.

12. The signal processing system of claim 1, wherein dynamically managing energy of the one or more clock signals comprises dynamically enabling and disabling the one or more clock signals based on the operational parameters.

13. The signal processing system of claim 12, wherein dynamically managing energy of the one or more clock signals comprises:
dynamically enabling the one or more clock signals when the physical electrical quantity is below a predetermined threshold; and
dynamically disabling the one or more clock signals when the physical electrical quantity is above the predetermined threshold.

14. The signal processing system of claim 1, wherein dynamically managing energy of the one or more clock signals comprises dynamically modifying the chopping frequency.

15. The signal processing system of claim 14, wherein dynamically modifying the chopping frequency comprises modifying the chopping frequency to a frequency level outside a frequency spectrum of the aggressor.

16. A method comprising:
chopping, with a chopper of a signal path of a signal processing system, a differential input signal to the signal path at a chopping frequency;
filtering out, with a low-pass filter downstream of the chopper, intermodulation products of a direct current offset of the signal path and intermodulation products of an aggressor on the differential input signal in order to generate an output signal;
chopping, with a second chopper downstream of the chopper and upstream of the low-pass filter, a first differential intermediate signal derived from the differential input signal at a second chopping frequency to generate a second differential intermediate signal; and
based on operational parameters associated with the signal path;
dynamically managing energy of one or more clock signals used to define the chopping frequency; and
dynamically managing energy of one or more clock signals used to define the second chopping frequency.

17. The method of claim 16, wherein dynamically managing energy of the one or more clock signals comprises dynamically modifying at least one of the chopping frequency and the second chopping frequency.

18. The method of claim 16, wherein dynamically modifying at least one of the chopping frequency and the second chopping frequency comprises modifying the chopping frequency and the second chopping frequency to have different frequency levels.

19. The method of claim 16, wherein the first chopping frequency is equal to the second chopping frequency.

20. The method of claim 16, wherein the signal path implements a sensor for sensing a physical electrical quantity.

21. The method of claim 20, wherein the physical electrical quantity comprises either a voltage associated with a battery or a current delivered from the battery.

22. The method of claim 21, wherein the operational parameters comprise operational conditions of a power converter and the physical electrical quantity is associated with operation of the power converter.

23. The method of claim 20, wherein the physical electrical quantity comprises either a voltage associated with an audio amplifier or a current associated with the audio amplifier.

24. The method of claim 16, wherein the operational parameters comprise one or more parameters selected from:
operational conditions of a battery;
a voltage associated with the battery; and
a current delivered from the battery.

25. The method of claim 16, wherein the operational parameters comprise operational conditions associated with an audio signal path comprising an amplifier.

26. The method of claim 25, wherein the operational parameters comprise characteristics of an audio signal within the audio signal path.

27. The method of claim 16, wherein dynamically managing energy of the one or more clock signals comprises dynamically enabling and disabling the one or more clock signals based on the operational parameters.

28. The method of claim 27, wherein dynamically managing energy of the one or more clock signals comprises:
dynamically enabling the one or more clock signals when the physical electrical quantity is below a predetermined threshold; and dynamically disabling the one or more clock signals when the physical electrical quantity is above the predetermined threshold.

29. The method of claim 16, wherein dynamically managing energy of the one or more clock signals comprises dynamically modifying the chopping frequency.

30. The method of claim 29, wherein dynamically modifying the chopping frequency comprises modifying the chopping frequency to a frequency level outside a frequency spectrum of the aggressor.

31. A mobile device, comprising:
a circuit;
a sensing system configured to sense a physical quantity associated with the circuit, the sensing system comprising:
   a sense path comprising:
      a chopper configured to chop a differential input signal to the sense path at a chopping frequency, wherein the differential input signal is indicative of the physical quantity;
      a low-pass filter downstream of the chopper and configured to filter out intermodulation products of a direct current offset of the sensor path and intermodulation products of an aggressor on the differential input signal in order to generate an output signal; and
      a second chopper downstream of the chopper and upstream of the low-pass filter configured to chop a first differential intermediate signal derived from the differential input signal at a second chopping frequency to generate a second differential intermediate signal; and
   a chop management circuit communicatively coupled to the chopper and the second chopper and configured to, based on operational parameters associated with the sensor path;
      dynamically manage energy of one or more clock signals used to define the chopping frequency; and
      dynamically manage energy of one or more clock signals used to define the second chopping frequency.

\* \* \* \* \*

UNITED STATES PATENT AND TRADEMARK OFFICE
CERTIFICATE OF CORRECTION

| | |
|---|---|
| PATENT NO. | : 11,652,455 B2 |
| APPLICATION NO. | : 17/173813 |
| DATED | : May 16, 2023 |
| INVENTOR(S) | : Kummaraguntla et al. |

It is certified that error appears in the above-identified patent and that said Letters Patent is hereby corrected as shown below:

In the Claims

1. In Column 8, Line 65, in Claim 1, delete "path;" and insert -- path: --, therefor.

2. In Column 10, Line 17, in Claim 16, delete "path;" and insert -- path: --, therefor.

3. In Column 12, Line 15, in Claim 31, delete "path;" and insert -- path: --, therefor.

Signed and Sealed this
Eighth Day of August, 2023

Katherine Kelly Vidal
*Director of the United States Patent and Trademark Office*